United States Patent
Kim et al.

(10) Patent No.: US 8,144,504 B2
(45) Date of Patent: Mar. 27, 2012

(54) METHOD OF OPERATING MAGNETIC RANDOM ACCESS MEMORY DEVICE

(75) Inventors: Kwang-seok Kim, Seongnam-si (KR); Sun-ae Seo, Hwaseong-si (KR); Kee-won Kim, Suwon-si (KR); In-jun Hwang, Yongin-si (KR); Hyung-soon Shin, Seoul (KR); Seung-yeon Lee, Seoul (KR); Seung-jun Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 238 days.

(21) Appl. No.: 12/458,411

(22) Filed: Jul. 10, 2009

(65) Prior Publication Data
US 2010/0008130 A1    Jan. 14, 2010

(30) Foreign Application Priority Data
Jul. 10, 2008  (KR) .................. 10-2008-0067205

(51) Int. Cl.
*G11C 11/00*   (2006.01)
(52) U.S. Cl. ............... 365/158; 365/189.16; 365/171; 365/209
(58) Field of Classification Search ................. 365/158, 365/189.16, 171, 209
See application file for complete search history.

(56) References Cited

U.S. PATENT DOCUMENTS

| | | | |
|---|---|---|---|
| 6,324,093 B1 | 11/2001 | Perner et al. | |
| 7,742,329 B2 * | 6/2010 | Yoon et al. | 365/158 |
| 7,764,537 B2 * | 7/2010 | Jung et al. | 365/158 |
| 2007/0070688 A1 | 3/2007 | Kuo et al. | |

FOREIGN PATENT DOCUMENTS

| | | |
|---|---|---|
| JP | 2002-170377 | 6/2002 |
| KR | 10-2004-0018369 | 3/2004 |
| KR | 10-2005-0016244 | 2/2005 |
| KR | 10-2005-0068479 | 7/2005 |
| KR | 10-2005-0086981 | 8/2005 |

* cited by examiner

*Primary Examiner* — Tuan T Nguyen
*Assistant Examiner* — Toan Le
(74) *Attorney, Agent, or Firm* — Harness, Dickey, & Pierce, P.L.C.

(57) ABSTRACT

Provided is a method of operating a magnetic random access memory device comprising a switch structure and a magnetoresistance structure. According to the method, current variation depending on the direction of the current can be reduced by controlling a gate voltage of the switch structure when supplying current to write data to the magnetoresistance structure.

9 Claims, 3 Drawing Sheets

METHOD OF OPERATING MAGNETIC RANDOM ACCESS MEMORY DEVICE

PRIORITY STATEMENT

This non-provisional U.S. patent application claims priority under 35 U.S.C. §119 to Korean Patent Application No. 10-2008-0067205, filed on Jul. 10, 2008, in the Korean Intellectual Property Office, the entire contents of which are incorporated herein by reference.

BACKGROUND

As the information industry develops, processing a large amount of information is required and, thus, the demand for high-capacity information storage media is continuously increasing. As the demand for the high-capacity information storage media increases, research into small-sized information storage media having high data storing speed have been conducted, and, as result, various types of conventional information storage devices have been developed.

Conventional information storage devices can largely be classified into volatile information storage devices and non-volatile information storage devices. In the volatile information storage devices, stored information is erased when power is turned off. However, the volatile information storage devices may write and read information at high speeds. In the non-volatile information storage devices, stored information is not erased when power is turned off.

A volatile information storage device may be a dynamic random access memory (DRAM). A hard disk drive (HDD) and a non-volatile random access memory (RAM) are non-volatile data storage devices. A magnetic random access memory (MRAM), which is a non-volatile information storage device, may use a magnetoresistance effect based on a spin dependent electron transport phenomenon.

Conventional MRAM devices may include a magnetoresistance structure and a switch structure which are connected to each other. The magnetoresistance structure may include an antiferro-magnetic layer, a pinned layer, a non-magnetic layer, and a free layer, and the switch structure may be a transistor.

MRAM devices may use a spin transfer torque (STT) phenomenon to address the problem of high writing current, and improve integrity and selectivity. In STT, a free layer of the MRAM device may be switched to a desired direction using a spin transfer of electrons by allowing a current in which spins are polarized to flow in the MRAM device. Densification may be realized since the required current is decreased as the cell size is reduced.

However, a critical current density required for switching the MRAM devices that use the STT phenomenon is too large for the magnetic memory devices to be commercialized. If a free layer of a magnetoresistance structure is magnetized in a direction different from that of a pinned layer, resistance is too large. If the free layer is magnetized in a same direction as that of the pinned layer, resistance is too small. Since the resistance may greatly vary depending on the direction of the magnetic filed, current flowing in the magnetoresistance structure may become asymmetric.

A conventional MRAM device may have a transistor structure including a source, a drain, and a gate electrode, and a magnetoresistance structure connected to the source or the drain. The magnetoresistance structure may be connected to a bit line, and the gate electrode may be connected to a word line.

In a process of writing information to a conventional MRAM device, a voltage VDD is applied via a word line regardless of the data to be stored. Accordingly, a source voltage Vs may be changed due to the direction the magnetoresistance structure is magnetized. Consequently, a current value $I_{DS}$ between the source and the drain flowing in a first direction may be different from the current value $I_{DS}$ flowing in a second direction between the source and the drain.

As a result, the amount of current +I and −I flowing through the magnetoresistance structure becomes asymmetric due to the difference of the current value $I_{DS}$ between the source and the drain. Therefore, a tunneling barrier layer of the magnetoresistance structure M may break, or current required to perform a writing operation may not be secured.

SUMMARY

Example embodiments relate to magnetic random access memory devices and methods of operating a magnetic random access memory device. Magnetic random access memory devices according to example embodiments may include a magnetoresistance structure and a switch structure.

Example embodiments include methods of operating a magnetic random access memory device by which symmetric current operation may be performed when writing information to and erasing information from the magnetic random access memory device.

According to at least some example embodiments, magnetic random access memory device comprising a magnetoresistance structure and a switch structure is operated by applying a first voltage to a gate of the switch structure to supply a current in a first direction to the magnetoresistance structure to write data to the magnetoresistance structure. The first voltage is at a level where the current in the first direction equals the current in a second direction.

At least one example embodiment provides a method of operating a magnetic random access memory device including a magnetoresistance structure and a switch structure. The method includes writing a first data to the magnetoresistance structure by supplying current in a direction from the switch structure to the magnetoresistance structure and applying a first gate voltage to a gate of the switch structure. Second data is written to the magnetoresistance structure by supplying current in a direction from the magnetoresistance structure to the switch structure. A second gate voltage is applied to the gate of the switch structure to write the second data. The first gate voltage may be greater than the second gate voltage.

The switch structure may include: a substrate including a source and a drain; and a gate structure formed on the substrate and connected to the source and the drain. The magnetic random access memory device may further include a driver circuit for changing the gate voltage. The driver circuit may be an NMOS word line driver circuit or a CMOS word line driver circuit.

Currents flowing in the source and the drain may be equal to each other in the first and second operations of the method of operating the magnetic random access memory device. The magnetoresistance structure may be electrically connected to the source or the drain via a conductive plug, and includes an antiferro-magnetic layer, a pinned layer, a non-magnetic layer and a free layer.

BRIEF DESCRIPTION OF THE DRAWINGS

Example embodiments will become apparent and more readily appreciated from the following description of the example embodiments, taken in conjunction with the accompanying drawings in which.

DETAILED DESCRIPTION

Figure 1:
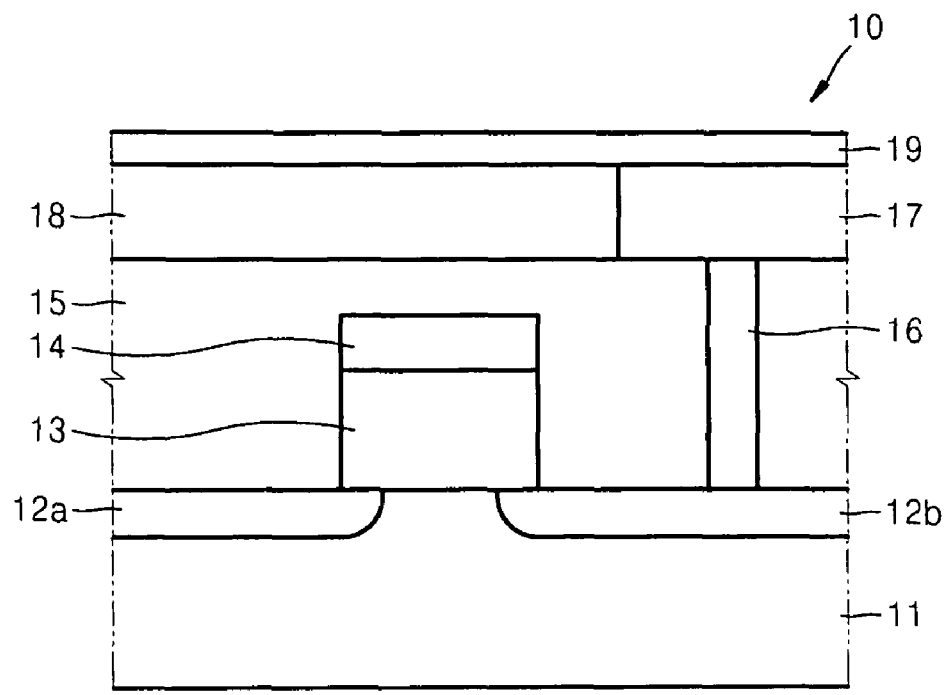
FIG. 1 is a cross-sectional view of a structure of a magnetic random access memory device according to an example embodiment.

Example embodiments of the present invention will be more clearly understood from the detailed description taken in conjunction with the accompanying drawings.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

Now, in order to more specifically describe example embodiments of the present invention, various embodiments of the present invention will be described in detail with reference to the attached drawings. However, the present invention is not limited to the example embodiments, but may be embodied in various forms. In the figures, if a layer is formed on another layer or a substrate, it means that the layer is directly formed on another layer or a substrate, or that a third layer is interposed therebetween. In the following description, the same reference numerals denote the same elements.

Although the example embodiments of the present invention have been disclosed for illustrative purposes, those skilled in the art will appreciate that various modifications, additions and substitutions are possible, without departing from the scope and spirit of the invention as disclosed in the accompanying claims.

FIG. 1 is a cross-sectional view of a structure of a magnetic random access memory (MRAM) device.

Referring to FIG. 1, a MRAM device 10 may include a first impurity region 12a and a second impurity region 12b formed on a substrate 11 and a gate insulating layer 13 and a gate electrode 14 formed on the substrate 11. A first interlayer insulating layer 15 may be formed on the substrate 11 and the gate electrode 14. A conductive plug 16 may be formed on the second impurity region 12b through the first interlayer insulating layer 15. The conductive plug 16 may be formed either on the first impurity region 12a or the second impurity region 12b. The first and second impurity regions 12a and 12b may function as a source/drain pair. A magnetoresistance structure 17 may be formed on the conductive plug 16.

The magnetoresistance structure 17 may include an antiferro-magnetic layer, a pinned layer, a non-magnetic layer and a free layer. In particular, the antiferro-magnetic layer may fix the magnetization direction of the pinned layer and is formed of a material such as IrMn, FeMn, NiMn, or PtMn. The pinned layer is a layer in which the magnetization direction may be fixed by the antiferro-magnetic, and the pinned layer and the free layer may be formed of NiFe, CoFe, or the like.

If the magnetoresistance structure 17 is a giant magnetoresistance (GMR) structure, the non-magnetic layer may be formed of a non-magnetic metal such as Cu. If the magnetoresistance structure 17 is a tunneling magneto-resistance (TMR) structure, the non-magnetic layer may be formed of an Al oxide, an Mg oxide, or the like. A second interlayer insulating layer 18 may be formed on a side of the magnetoresistance structure 17, and a bit line 19 may be formed on the magnetoresistance structure 17 and the second interlayer insulating layer 18.

Even though not shown in FIG. 1, the gate electrode 14 may be connected to a word line, and the source is connected to a common line.

Hereinafter, a method of operating a MRAM device according to embodiments of the present invention will be described more fully with reference to the accompanying drawings.

Figure 2A:
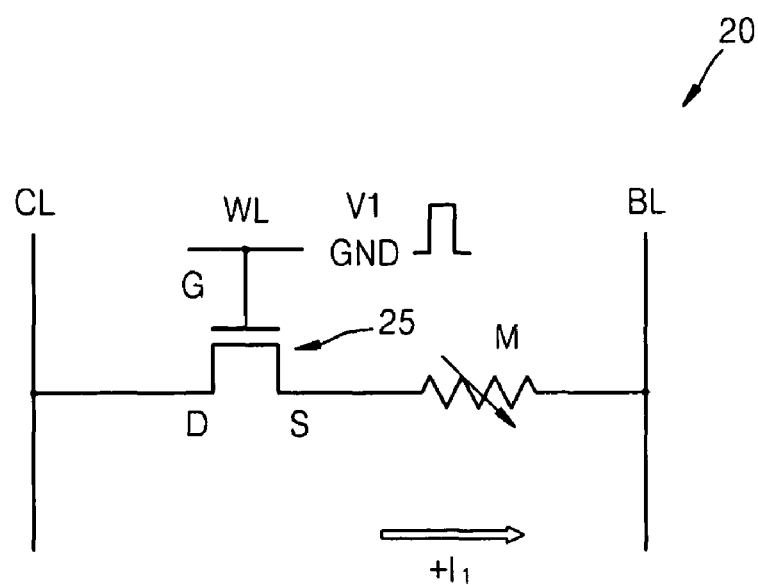
FIGS. 2A and 2B are circuit diagrams illustrating information writing data to a magnetic random access memory device according to an example embodiment.
Figure 2B:
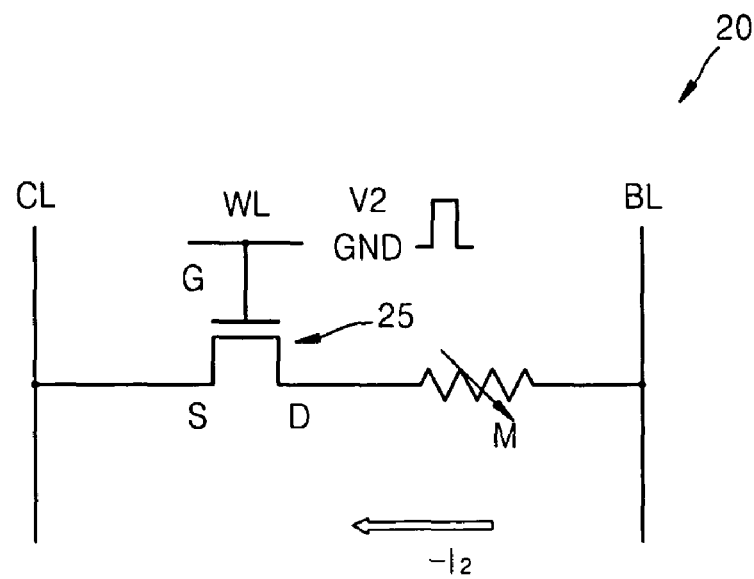

FIGS. 2A and 2B are circuit diagrams illustrating writing first and second data, respectively, to a MRAM device according to an example embodiment. According to a MRAM device 20, as shown in FIGS. 2A and 2B, a constant current value may be maintained regardless of a direction of current by controlling a gate voltage while performing a writing operation writing data. In particular, when a current is supplied to a magnetoresistance structure in order to write data, a gate voltage Vg of a transistor may be changed in order to minimize current variation depending on the current direction and, thus, a constant gate-source voltage Vgs is maintained regardless of the current direction. The MRAM device 20 may have a similar configuration as the MRAM device 10, shown in FIG. 1.

As shown in FIGS. 2A and 2B, the MRAM device 20 may include a switch structure 25 and a magnetoresistance structure M. The switch structure 25 may be a transistor. For example, the switch structure 25 may include a gate G, a drain D and a source S. Referring to FIG. 2A, when current $+I_1$ is supplied in a direction from the switch structure 25 to a magnetoresistance structure M to write a first data, for example, "1", electrons flow from a bit line BL through the magnetoresistance structure M. In this regard, an impurity region which is electrically connected to the magnetoresistance structure M is the source S.

Referring to FIG. 2B, when a current $-I_2$ is supplied in a direction from the bit line BL to the switch structure 25 through the magnetoresistance structure M to write a second data, for example, "0" to the magnetoresistance structure M, electrons flow from the drain D to the bit line BL through the magnetoresistance structure M. The positions of the source S and the drain D of the switch structure 25 of FIG. 2A is opposite to those of the switch structure 25 of FIG. 2B. Therefore, ff the same gate voltage Vg is applied to the word lines WL of FIGS. 2A and 2B, the values of $+I_1$ and $-I_2$ may be significantly different.

In particular, if the magnetoresistance structure M has a resistance of $R_M$, a source voltage Vs of FIG. 2A is $R_M*I$ (volt), but the source voltage Vs of FIG. 2B is close to 0 (volt). If a gate source voltage Vgs difference is caused by the source voltage Vs difference in the operations of FIGS. 2A and 2B, asymmetry between the current values $+I_1$ and $-I_2$ flowing in the magnetoresistance structure M may be caused. For example, if the MRAM device 20 is designed based on the value of current $+I_1$, the value of current $-I_2$ may become so large that a non-magnetic layer of the magnetoresistance structure M can break. On the other hand, if the MRAM device 20 is designed based on the value of current $-I_2$, the value of current $+I_1$ may become so low that data input may not be easily performed in the magnetoresistance structure M.

Thus, if first data is written to the MRAM device 20, a gate voltage V1 may be applied through the word line WL. If second data is written to the MRAM device, a gate voltage V2 is applied through the word line WL. Gate voltage V1 may be greater than gate voltage V2. The gate voltages V1 and V2 may be controlled so that current values $+I_1$ and $-I_2$ flowing in the source S and the drain D, respectively, are equal to each other when the first data and the second data are written to the magnetoresistance structure M. Therefore, the current value of $-I_2$ equals the current value of $-I_1$.

Particularly, the gate voltages V1 and V2 may be set as follows. First, a MRAM device including a transistor structure and a magnetoresistance structure as shown in FIG. 1 is manufactured. Then, as shown in FIG. 2A, the gate voltage V1 for supplying the source and drain current $I_{DS}$ of $+I_1$ which can write information to the magnetoresistance structure M may be set. Then, as shown in FIG. 2B, the gate voltage V2 for supplying the source and drain current $I_{DS}$ of $-I_2$ which can write information to the magnetoresistance structure M may be set. In this regard, the gate voltages V1 and V2 may be set such that $+I_1$ and $-I_2$ are equal to each other for the symmetric current operation. As a result, if the current flows from the source S or the drain D to the magnetoresistance structure M, current drop caused by the direction of current flow may be inhibited by controlling the gate voltages V1 and V2.

Thus, when the first data and the second data are written to the magnetoresistance structure M, currents flowing in the source S and the drain D may be equal to each other. That is, circuits may be stably designed due to the symmetric current operation.

Figure 3A:
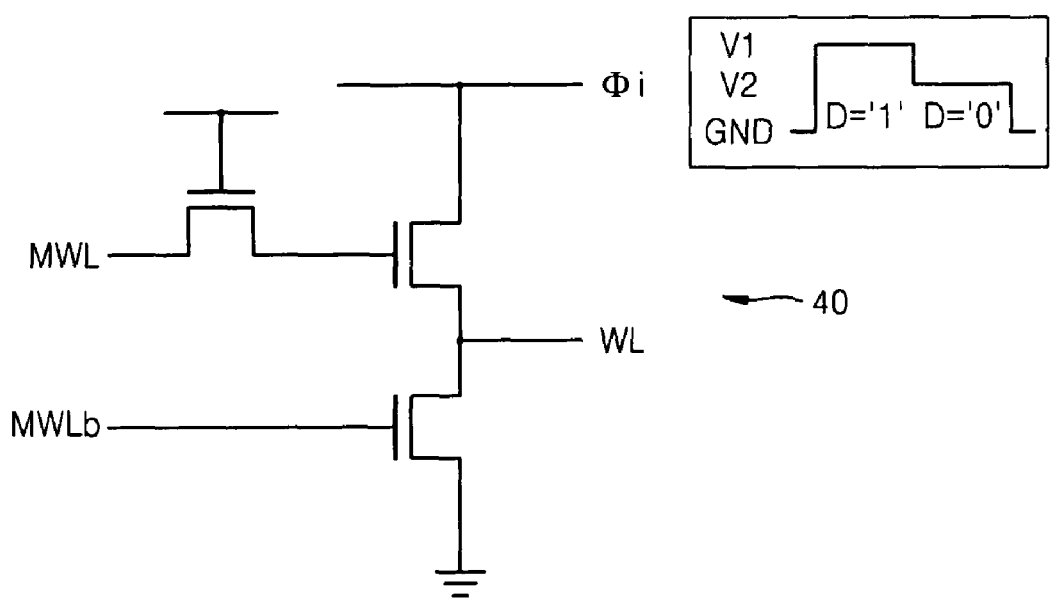
FIGS. 3A and 3B are diagrams illustrating driver circuits of a magnetic random access memory device according to an example embodiment.
Figure 3B:
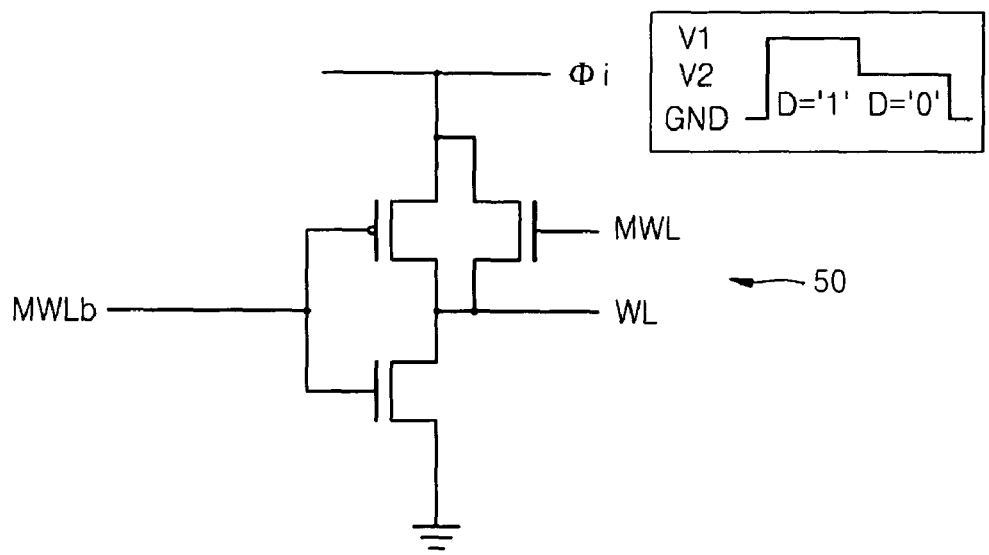

FIGS. 3A and 3B are diagrams illustrating driver circuits of a MRAM device according to embodiments of the present invention in which voltage is applied to a word line WL. A word line driver is used to apply voltage to the word line WL. FIG. 3A illustrates an NMOS word line driver 40, and FIG. 3B illustrates a CMOS word line driver 50. The method of operating the MRAM device according to example embodiments may selectively use an NMOS word line driver or a CMOS word line driver. In FIGS. 3A and 3B, MWL and MWLb are signals used to select one of the pluralities of the word lines WLs connected to Φi and generated by a row address decoder. For example, if the MWL is high, a voltage of the Φi is applied to the word line WL. If the MWL is low, a ground voltage is applied to the word line WL. Referring to FIG. 3A, the voltage of the Φi is applied to the word line WL only through the NMOS, a voltage drop caused by a threshold voltage of the NMOS occurs if the MWL voltage is not greater than the Φi voltage. Referring to FIG. 3B, a voltage drop does not occur by aligning PMOS in parallel.

Referring to FIGS. 3A and 3B, when data "1" is input, the voltage V1 may be applied to the word line WL. When data "0" is input, the voltage V2 may be applied to the word line WL. In this regard, the voltage V1 or V2 may be applied to the word line WL using a φi signal corresponding to a selected row address.

Figure 4:
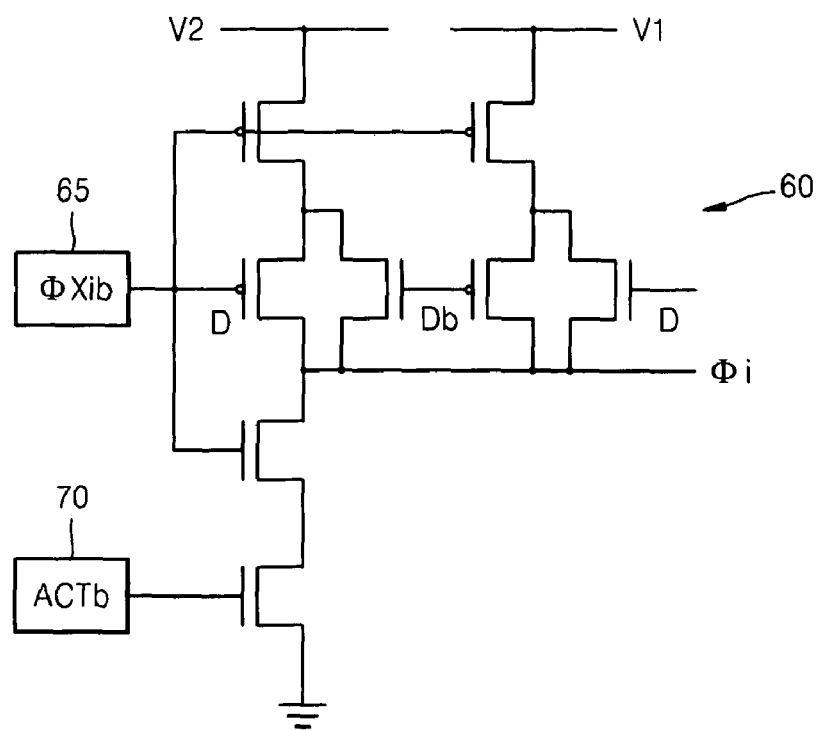
FIG. 4 is a circuit diagram illustrating a current generator of a magnetic random access memory device according to an example embodiment.

FIG. 4 is a circuit diagram illustrating a φi signal generator 60. Referring to FIG. 4, a row address signal φXib is received from a row address pre-decoder 65. The φi signal allows application of one of voltages V1 and V2 using an ACTb signal from an active generator 70, to control an active region in which the word line WL is arranged. A signal D may be activated when "1" is written and a signal Db may be activated when data "0" is written. The Φi signal generator 60 transfers V1 and V2 to the circuits illustrated in FIGS. 3A and 3B according to data "1" and "0" so as to apply voltage V1 or V2 to the word line WL.

In a reading operation of the MRAM device 20, the signals D and Db may be inactivated.

According to the method of operating the MRAM device, current variation depending on the current direction can be reduced by controlling the gate voltage when the writing operation for inputting data is performed.

While example embodiments have been particularly shown and described with reference to the example embodiments shown in the figures, it will be understood by those of ordinary skill in the art that various changes in form and details may be made therein without departing from the spirit and scope of the present invention as defined by the following claims.

What is claimed is:

1. A method of operating a magnetic random access memory device including a magnetoresistance structure and a switch structure, the method comprising:
    applying a first gate voltage to a gate of the switch structure to supply a first current in a first direction to the magnetoresistance structure to write first data to the magnetoresistance structure; and
    applying a second gate voltage to the gate of the switch structure to supply a second current in a second direction to the magnetoresistance structure to write second data to the magnetoresistance structure, the first gate voltage being at a level where the first current equals the second current.

2. The method of claim 1, wherein the first gate voltage is greater than the second gate voltage.

3. A method of claim 1, wherein the switch structure further includes,
    a source and a drain on a substrate, the gate being formed on the substrate and coupled to the source and the drain.

4. The method of claim 3, wherein the magnetic random access memory device further comprises a driver circuit for changing the gate voltage.

5. The method of claim 4, wherein the driver circuit is an NMOS word line driver circuit or a CMOS word line driver circuit.

6. The method of claim 3, wherein the magnetoresistance structure is electrically connected to the source or the drain via a conductive plug, and comprises an antiferro-magnetic layer, a pinned layer, a non-magnetic layer and a free layer.

7. The method of claim 6, wherein the switch structure further includes,
    a first interlayer insulating layer formed on the substrate and the gate, and
    first and second impurity regions formed on the substrate, wherein
    the conductive plug is formed on the second impurity region through the first interlayer insulating layer.

8. The method of claim 1, further comprising:
    generating, by a driver circuit, the first voltage based on a signal corresponding to a selected row address.

9. The method of claim 8, wherein the generating step includes generating the signal based on a row address signal, an active signal and a signal indicating whether the first data or the second data is to be written.

* * * * *